US008675392B2

(12) United States Patent
Srinivasan et al.

(10) Patent No.: US 8,675,392 B2
(45) Date of Patent: *Mar. 18, 2014

(54) METHODS OF READING AND USING MEMORY CELLS

(75) Inventors: Bhaskar Srinivasan, Plano, TX (US); Gurtej S. Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 13/463,794

(22) Filed: May 3, 2012

(65) Prior Publication Data

US 2012/0218810 A1    Aug. 30, 2012

Related U.S. Application Data

(63) Continuation of application No. 12/564,265, filed on Sep. 22, 2009, now Pat. No. 8,199,556.

(51) Int. Cl.
*G11C 11/21*    (2006.01)
*G11C 7/22*    (2006.01)
*G11C 7/12*    (2006.01)
*G11C 8/08*    (2006.01)
*G11C 8/18*    (2006.01)

(52) U.S. Cl.
USPC .............. 365/148; 365/189.15; 365/189.16; 365/233.16; 365/233.17; 365/194

(58) Field of Classification Search
USPC ........... 365/148, 189.15, 189.01, 158, 48, 55, 365/97, 131, 173, 172, 218, 230.03, 163, 365/200, 63, 189.05, 225.7, 189.16, 194, 365/233.16, 233.17
See application file for complete search history.

(56) References Cited

U.S. PATENT DOCUMENTS

| | | | |
|---|---|---|---|
| 6,842,357 B2 | 1/2005 | Brown | |
| 7,095,644 B2 * | 8/2006 | Chevallier et al. | 365/148 |
| 7,236,389 B2 | 6/2007 | Hsu | |
| 7,446,010 B2 | 11/2008 | Li et al. | |
| 7,471,556 B2 | 12/2008 | Chow et al. | |
| 7,646,658 B2 * | 1/2010 | Chen et al. | 365/210.1 |
| 7,864,564 B2 * | 1/2011 | Hidaka | 365/158 |

(Continued)

FOREIGN PATENT DOCUMENTS

WO  PCT/US2010/045856    4/2011
WO  PCT/US2010/045856    3/2012

OTHER PUBLICATIONS

Driscoll et al., "Phase-transition driven memristive system", Applied Physics Letters (Online), vol. 95(4), Jul. 2009.

(Continued)

*Primary Examiner* — J. H. Hur
(74) *Attorney, Agent, or Firm* — Wells St. John P.S.

(57) ABSTRACT

Some embodiments include methods of reading memory cells. The memory cells have a write operation that occurs only if a voltage of sufficient absolute value is applied for a sufficient duration of time; and the reading is conducted with a pulse that is of too short of a time duration to be sufficient for the write operation. In some embodiments, the pulse utilized for the reading may have an absolute value of voltage that is greater than or equal to the voltage utilized for the write operation. In some embodiments, the memory cells may comprise non-ohmic devices; such as memristors and diodes.

14 Claims, 5 Drawing Sheets

(56) References Cited

U.S. PATENT DOCUMENTS

| | | |
|---|---|---|
| 8,199,556 B2 * | 6/2012 | Srinivasan et al. ............ 365/148 |
| 2006/0157679 A1 | 7/2006 | Scheuerlein |
| 2006/0209585 A1 * | 9/2006 | Tanizaki et al. ............... 365/148 |
| 2007/0002665 A1 | 1/2007 | Windlass et al. |
| 2007/0224770 A1 | 9/2007 | Nagashima |
| 2007/0268737 A1 | 11/2007 | Hidaka |
| 2008/0043519 A1 * | 2/2008 | Kitagawa et al. ............. 365/158 |
| 2008/0165566 A1 | 7/2008 | Park et al. |
| 2008/0247219 A1 * | 10/2008 | Choi et al. .................... 365/148 |
| 2008/0285342 A1 * | 11/2008 | Liu et al. ................... 365/185.03 |
| 2008/0298143 A1 | 12/2008 | Chen et al. |
| 2008/0308783 A1 | 12/2008 | Ahn et al. |
| 2009/0168481 A1 * | 7/2009 | Stipe .............................. 365/51 |
| 2009/0201715 A1 | 8/2009 | Kreupl |

OTHER PUBLICATIONS

Hummer et al., "Origin of Nanoscale Phase Stability Reversals in Titanium Oxide", The Journal of Physical Chemistry C, vol. 113(11), Feb. 2009, pp. 4240-4245.

Lee et al., "2-stack 1D-1R Cross-Point Structure with Oxide Diodes as Switch Elements for High Density Resistance RAM Applications", IEEE, 2007, pp. 771-774.

* cited by examiner

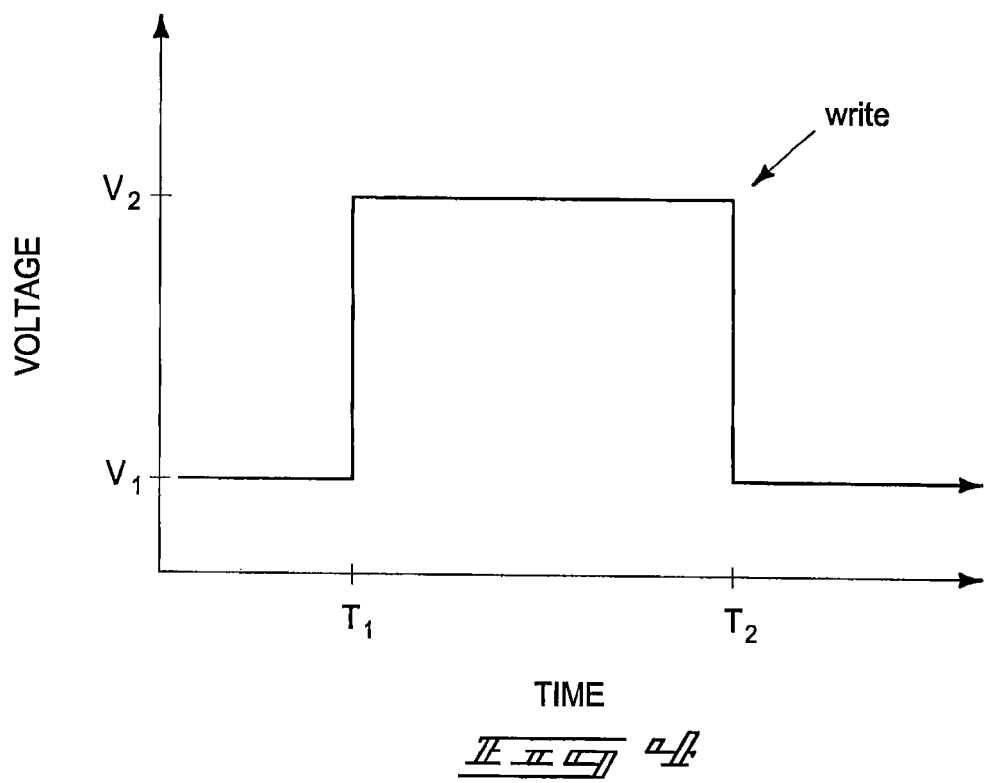
_FIG. 4_
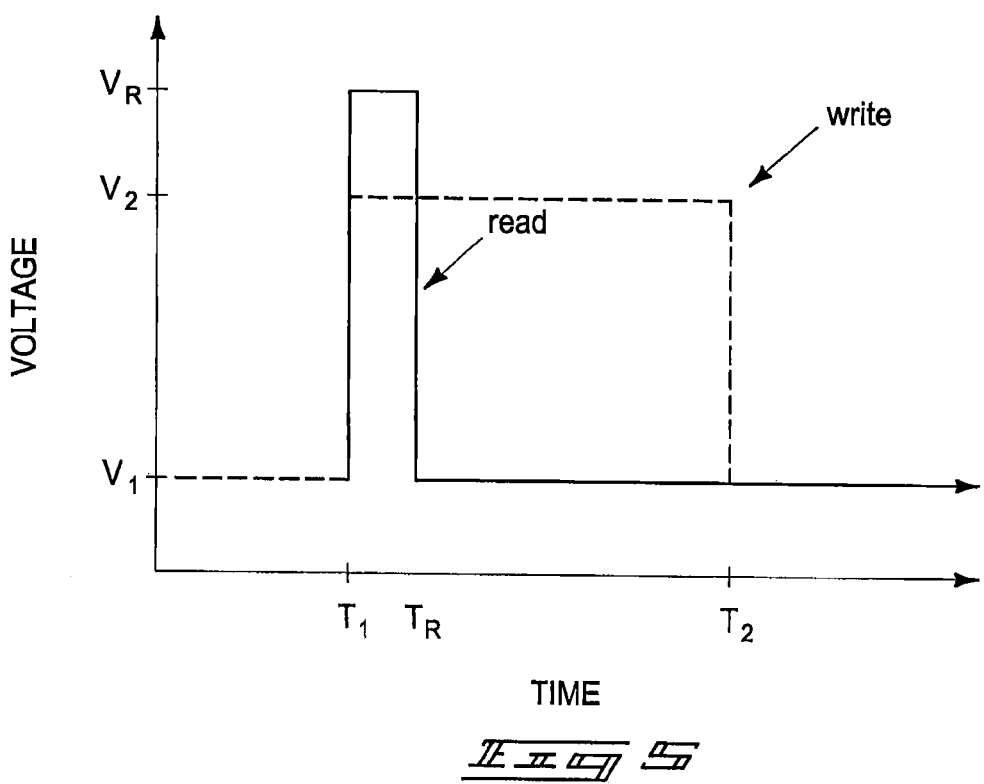
_FIG. 5_

US 8,675,392 B2

METHODS OF READING AND USING MEMORY CELLS

RELATED PATENT DATA

This patent resulted from a continuation of U.S. patent application Ser. No. 12/564,265, which was filed Sep. 22, 2009, and which is hereby incorporated herein by reference.

TECHNICAL FIELD

Methods of reading and using memory cells.

BACKGROUND

Memory cells are common constituents of integrated circuitry. An individual memory cell comprises a device that exists in two or more stable memory states. The act of "writing" to the device comprises placing the device into a desired memory state; and the act of "reading" the device comprises determination of which of the memory states the device is in.

The writing to the device may comprise imparting a programming voltage to the device, with the programming voltage being a voltage sufficient to cause the device to change from one memory state to another. The reading of the device may comprise measurement of an electrical parameter influenced by the memory state of the device, such as, for example, measurement of current passing through the device. It can be desired that the reading be conducted under conditions which do not alter the memory state of the device, so that the reading operation does not "write" to the device.

One way of avoiding undesired alteration of the memory state of a memory device during a reading operation is to conduct the reading at a voltage much less than the programming voltage. However, differences between the memory states of memory devices may become larger, and thus more easily measured, as voltages on the devices are increased. Thus, the reading of a memory device may comprise a trade-off between a desire to read the device accurately and quickly, and a desire to avoid alteration of the memory state of the device during the reading operation.

It would be desirable to develop new methods for reading memory devices which enable the devices to be read quickly and accurately.

BRIEF DESCRIPTION OF THE DRAWINGS

FIG. 4 is a graphical illustration of voltage vs. time relationships of an example memory cell, and illustrates a lag occurring during a writing operation.

FIG. 5 is a graphical illustration of voltage vs. time relationships of the example memory cell of FIG. 4, and illustrates a read operation being conducted with a duration much shorter than the lag of the writing operation.

DETAILED DESCRIPTION OF THE ILLUSTRATED EMBODIMENTS

The programming of memory cells may comprise provision of sufficient voltage (often called a programming voltage) to the cells to enable the cells to transition from one memory state to another. Some memory cells have a significant lag (three microseconds or more) between the time that a programming voltage is applied and the time that the cells transition from one memory state to another. Such lag may be the result of atomic and/or molecular rearrangements occurring in the memory cells during the transitioning between the memory states.

The memory cells that experience significant lag in transitioning from one memory state to another are sometimes referred to as being "frequency dependent" relative to a writing operation. The term "frequency dependent" is utilized to indicate that a programming pulse will need to be provided for a specific duration before the memory cell will switch from one memory state to another. For instance, if a memory cell has a lag of three microseconds ($3 \times 10^{-6}$ seconds), then a programming pulse will need to be provided for at least three microseconds during a write operation in order to switch the memory cell from one memory state to another. Another way to express this is that the programming pulse will need to have a frequency of less than or equal to the inverse of $3 \times 10^{-6}$ seconds (i.e., less than or equal to $3.3 \times 10^5$ sec$^{-1}$).

Memory cells containing non-ohmic components (for instance, memristors and diodes) often have frequency dependent writing operations. The frequency dependency of the writing operations may be considered problematic in the prior art, in that such slows down the writing operations. However, some embodiments of the present invention take advantage of the frequency dependency of the writing operations to enhance the reading operations of the memory devices.

Figure 1:
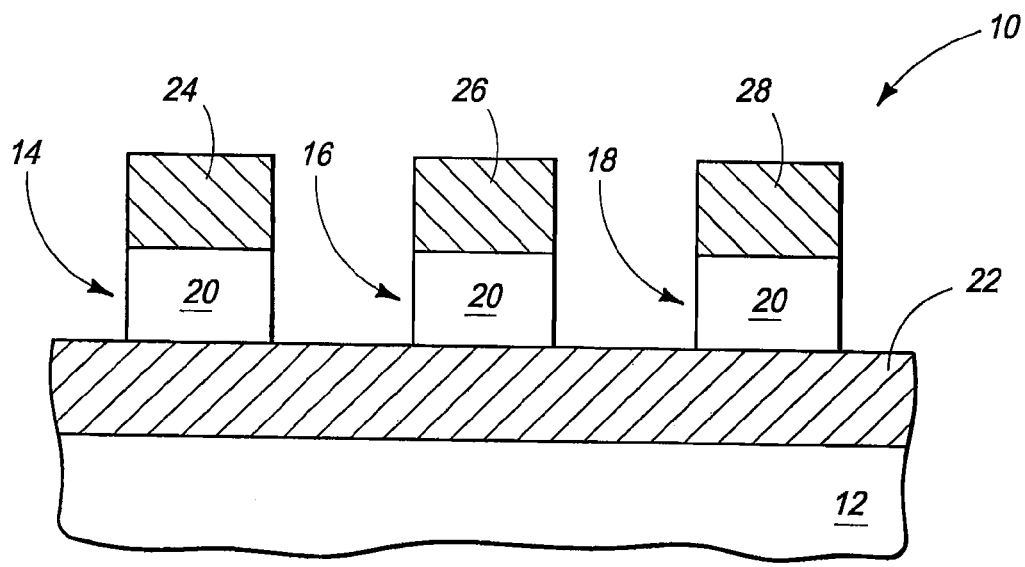
FIG. 1 is a diagrammatic cross-sectional view of a region of a semiconductor construction, illustrating a portion of a memory array.

A portion of an example array of memory cells is shown in FIG. 1 as part of a semiconductor construction 10. The construction includes a substrate 12 supporting a plurality of memory cells 14, 16 and 18.

The memory cells comprise memory cell structures 20. Although the memory cell structures are shown to be homogeneous, such structures may be nonhomogeneous in some embodiments; and may, for example, comprise a stack of two or more compositionally-different layers. The memory cell structures may comprise any suitable composition or combination of compositions configured to have at least two stable memory states which may be interchanged by exposing the memory cell structures to a changed condition (for instance, by applying a voltage across the memory cell).

The memory cells may comprise configurations having frequency dependent writing operations, and in some embodiments may comprise non-ohmic devices; such as, for example, memristors and/or diodes. In example embodiments in which the memory cells correspond to memristors, the memory cell structures may comprise titanium oxide. The titanium oxide may be provided in two separate phases within the memory cell structures, with one of the phases being relatively oxygen rich and the other being relatively oxygen deficient. The titanium oxide may be provided between a pair of platinum electrodes. As another example, the memristors may comprise one or both of crystalline zirconium oxide and crystalline hafnium oxide between a pair of titanium nitride electrodes. If the memory cell structures include memristors that comprise oxide between a pair of electrodes, such oxide may be referred to as memory cell material.

The construction 10 includes a plurality of electrically conductive lines 22, 24, 26 and 28. The lines 24, 26 and 28 extend orthogonally to the line 22, and extend in and out of the page relative to the cross-section of FIG. 1. The lines 22, 24, 26 and 28 may comprise any suitable electrically conductive composition, or combination of compositions; and in some embodiments may comprise one or more of various metals (for instance, platinum, titanium, tungsten, etc.), metal-containing compounds (for instance, metal silicides, metal nitride, etc.), and conductively-doped semiconductor materials (for instance, silicon, germanium, etc.). Although the lines are shown to be homogeneous, the lines may be nonhomogeneous in some embodiments; and may, for example, comprise stacks of two or more compositionally-different layers. The electrodes discussed above regarding example memristors may be comprised by the lines adjacent the memory structure, or may be comprised by the memory structure itself.

Each of the memory cells 14, 16 and 18 is at an intersection where two orthogonal lines cross. The crossing lines may be utilized to uniquely address the various memory cells. For instance, memory cell 14 may be uniquely addressed as the cell triggered when electrical input is provided along both of lines 22 and 24. In some embodiments, the writing to cell 14 will comprise provision of a programming voltage across the cell. The programming voltage will correspond to a voltage differential between line 24 and line 22. Such voltage differential may be delivered to the cell by providing part of the differential along line 22 and the other part across line 24. For instance, if a write voltage of "q" millivolts is to be provided to cell 14 (where "q" is any appropriate number), then a fraction of the "q" millivolts may be provided along line 22 (for instance q/2) and a remaining fraction of the "q" millivolts may be provided along line 24 (for instance, −q/2) so that a total voltage differential across memory cell 14 is "q" millivolts. If approximately half of the voltage differential is carried by each of the intersecting lines, the cell may be referred to as a half-select memory device. It can be advantageous to utilize half-select devices, in that this can reduce the voltage carried by any line, and can thus reduce undesired effects on neighboring cells when addressing a specific cell.

The reading of information from a memory cell may also comprise application of a voltage differential across the cell, and such differential may be carried across the intersecting lines analogously to the situation discussed above regarding the writing of information to the memory cells.

Substrate 12 may comprise any suitable composition or combination of compositions. In some embodiments, substrate 12 may be a semiconductor substrate, and may comprise, consist essentially of or consist of for example, monocrystalline silicon lightly-doped with background p-type dopant. The terms "semiconductive substrate" and "semiconductor substrate" mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" means any supporting structure, including, but not limited to, the semiconductive substrates described above. Although the substrate is shown to be homogeneous, the substrate may be nonhomogeneous in some embodiments; and may, for example, comprise various structures and layers associated with integrated circuit fabrication. Such structures and layers may comprise any suitable electrical properties of the constructions being fabricated, and may thus be electrically conductive, electrically insulative, or semiconductive, in various embodiments.

Figure 2:
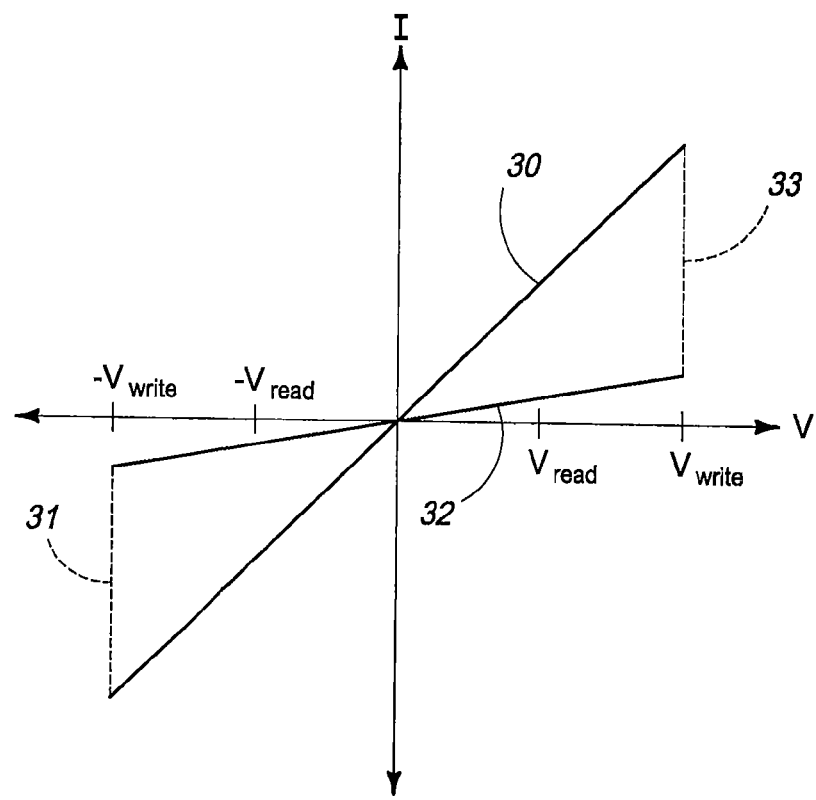
FIG. 2 is a graphical illustration of current vs. voltage relationships of an example memory cell.

FIG. 2 shows a graph of current (I) versus voltage (V), and illustrates operation of an example memory cell. The graph may be considered to comprise two intersecting lines 30 and 32 that cross at the origin. Each line corresponds to a different memory state of the memory cell. The signs of the current and voltage are such that the difference between lines 30 and 32 is negative on the left half of the graph and positive on the right half of the graph. In order to simplify the discussion of the graph of FIG. 2, several properties will be discussed relative to an "absolute value"; with the term "absolute value" having the classical mathematical meaning of being the numerical value of a number regardless of sign.

At zero voltage (i.e., at the origin of the graph of FIG. 2), the memory states corresponding to lines 30 and 32 cannot be distinguished from one another. However, as the absolute value of the voltage increases, the states become discernible from one another. Specifically, the absolute value of current through the memory cell at any given voltage is higher when the cell is in the memory state 30 than when the cell is in the memory state 32. The absolute value of the current difference between the memory states 30 and 32 increases as the absolute value of the voltage increases until the absolute value of the voltage reaches a level corresponding to the write voltage ($V_{write}$ or $-V_{write}$). At the write voltage, the memory states 30 and 32 interchange with one another (as represented by the dashed lines 31 and 33).

In the shown embodiment, the performance of the memory cell is symmetric about the origin. In other words, the absolute value of current flowing through the memory cell is identical regardless of whether positive voltage is applied or negative voltage is applied. The only difference between the current flow induced by negative voltage relative to that induced by positive voltage is the direction of the current flow; which is illustrated in the graph as a difference between whether the current flow is positive or negative.

Reading of the memory cell represented by the graph of FIG. 2 corresponds to a determination of whether the memory cell is in the memory state represented by line 32, or the memory state represented by line 30. Such determination may comprise applying a voltage to the memory cell, and then determining if the current flow through the memory cell is high enough to correspond to state 30, or instead corresponds to state 32. The difference between states 30 and 32 is larger, and accordingly easier to detect, at voltages having a high absolute value than at voltages having a low absolute value. Accordingly, the state of the memory cell may be read with higher accuracy at voltages having a high absolute value than at voltages having a low absolute value. However, if the voltage utilized during the read operation ($V_{read}$ or $-V_{read}$) becomes too close to the write voltage, the state of the cell may be disturbed during the read operation to the extent that the cell may switch from one state to another—which would destroy the accuracy of the read operation. Thus, conventional methods of reading memory cells utilize an absolute value of $V_{read}$ that is sufficiently below the absolute value of $V_{write}$ to avoid inadvertently altering the state of the memory cell during the read operation.

A couple of example $V_{read}$ voltages are illustrated in FIG. 2 as having absolute values well below the absolute values of the $V_{write}$ voltages. Some embodiments of the invention (discussed below with reference to FIGS. 3-8) take advantage of the lag times of frequency dependent write operations to enable the absolute voltage of a read operation to approach, or even exceed, the absolute voltage of a write operation.

Figure 3:
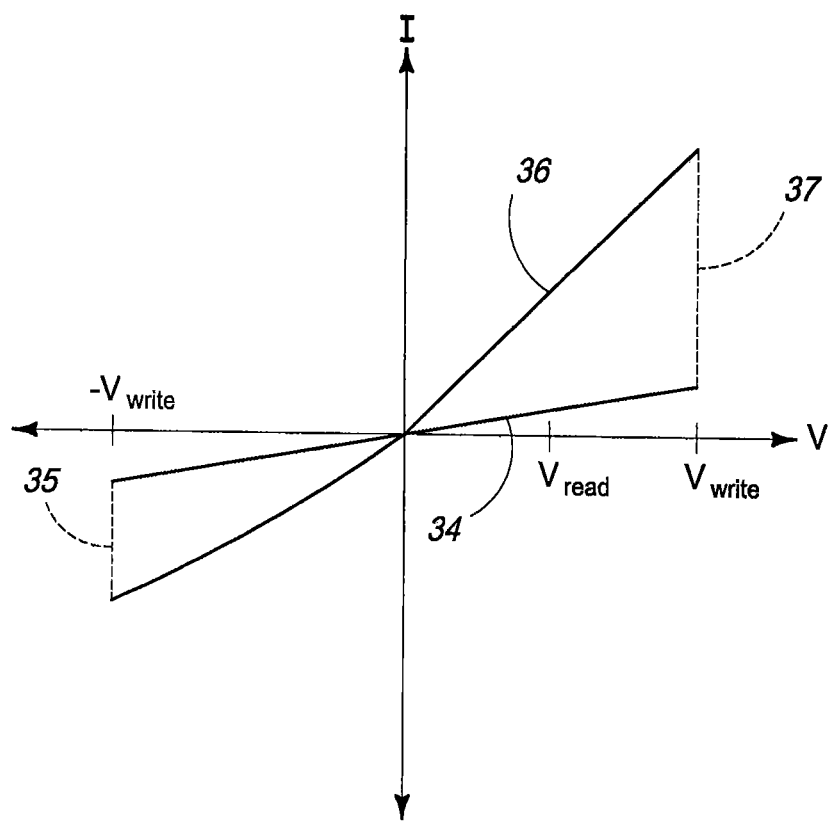
FIG. 3 is a graphical illustration of current vs. voltage relationships of another example memory cell.

The graph of FIG. 2 shows a memory cell having symmetric performance regardless of whether positive voltage is applied to the memory cell or negative voltage is applied. The embodiments described herein may be utilized with either memory cells having symmetric performance relative to positive and negative voltage, or with memory cells having asymmetric performance relative to positive and negative voltage. FIG. 3 shows a graph of current (I) versus voltage (V) for operation of an example memory cell that has asymmetric performance relative to positive voltage and negative voltage. The graph of FIG. 3 comprises two intersecting lines 34 and 36 that cross at the origin. Each line corresponds to a different memory state of the memory cell. At zero voltage (i.e., at the origin of the graph of FIG. 3), the memory states cannot be distinguished from one another. As the absolute value of the voltage increases, the absolute value of current through the memory cell is higher when the cell is in the memory state 36 relative to when the cell is in the memory state 34. The absolute value of the current difference between the memory states 34 and 36 increases regardless of whether positive voltage is applied to the memory cell, or negative voltage is applied. However, the current difference between the two states changes more quickly when positive voltage is applied than when negative voltage is applied. Thus, it is easier to read the cell using positive voltage during the read operation than it is using negative voltage. According, the example read voltage ($V_{read}$) is shown as a positive voltage. Although the asymmetric memory cell represented in FIG. 3 has a greater difference occurring between states 34 and 36 at positive voltage than negative voltage, other asymmetric cells may have the greater difference occurring at negative voltage than at positive voltage.

The asymmetric memory cell of FIG. 3 is similar to the symmetric cell of FIG. 2 in that once the absolute value of the voltage reaches a level corresponding to the write voltage ($V_{write}$ or $-V_{write}$), the memory states 34 and 36 can interchange with one another, (as represented by the dashed lines 35 and 37).

FIG. 4 graphically illustrates a relationship of voltage versus time for a memory cell that has a lag during a write operation. The voltage applied to the device is at an initial value $V_1$, which is less than the programming voltage. At a time $T_1$ the voltage is increased to a second value $V_2$ which corresponds to the programming voltage. The programming voltage is maintained for a period of time; and the writing operation does not occur at the time $T_1$, but rather at a time $T_2$ subsequent to $T_1$. The delay between the time $T_1$ when the programming voltage is initially applied, and the time $T_2$ when the writing operation is complete, is a lag in the response of the memory cell to the programming voltage. Such lag may be due to, for example, time needed for atomic and/or molecular rearrangement in the memory cell in transitioning from one memory state to another. The duration of the programming pulse from $T_1$ to $T_2$ will vary depending on various factors which may include, for example, the type of material utilized in the memory cell, the programming voltage, and the amount of material utilized in the memory cell. The memory cell will not change from one memory state to another unless a pulse of sufficient voltage is provided for a sufficient duration of time. Since a time duration may be converted to a frequency by simply taking the inverse of the time duration, the memory cell having the programming characteristics shown in FIG. 4 may be alternatively described as having a frequency dependent write operation.

The voltages $V_1$ and $V_2$ of FIG. 4 may be absolute values of voltages as graphed, and the actual voltages utilized during the writing operation may be either negative voltages or positive voltages.

FIG. 5 graphically illustrates a relationship of voltage versus time for the memory cell of FIG. 4 during a reading operation, with such reading operation being superimposed on the writing operation described above with reference to FIG. 4 (the writing operation is shown in dashed-line in FIG. 5). The reading operation utilizes a voltage $V_R$, and in the embodiment of FIG. 5 such voltage is greater than the programming voltage $V_2$ utilized during the writing operation. In other embodiments, the reading voltage $V_R$ may be equal to the programming voltage, or less than the programming voltage. However, it can be advantageous to utilize a high reading voltage in order to enhance a difference between memory states of the memory cell (as discussed above with reference to FIG. 2). Greater differences between the memory states of the memory cell during the reading operation can lead to better signal-to-noise during the reading operation, which can enhance the accuracy of the reading operation and/or the speed of the reading operation.

The reading voltage $V_R$ is initiated at the time $T_1$ and maintained until the time $T_R$. The duration between the times $T_R$ and $T_1$ is much less than the duration required for the writing operation (i.e., the duration between the times $T_2$ and $T_1$). For instance, the duration utilized for the reading operation may be at least about an order of magnitude shorter (i.e., at least about 10 times shorter) than the duration necessary for the writing operation. The short voltage pulse utilized for the read operation can enable the read operation to be conducted at high voltage without inadvertently causing a write operation. Specifically, the voltage pulse utilized for the read operation is conducted for too short of a duration to overcome the lag of the writing operation, and therefore the memory cell does not change from one memory state to another in spite of the high voltage utilized during the read operation.

The specific duration of the reading operation of FIG. 5 may be tailored for particular applications. In an example application, a memory cell may comprise a memristor containing titanium oxide and having a write operation requiring a duration of at least about three microseconds to complete the transition from one memory state to another. In such application, the read operation may be conducted with a pulse having a duration of less than or equal to about 0.3 microseconds (or other words, having a frequency of at least about $3.3\times10^6$ seconds$^{-1}$). In another example application, the memory cell may comprise a memristor having a write operation requiring a duration of at least about one millisecond to complete the transition from one memory state to another, and the read operation may be conducted with a pulse having a duration of less than or equal to 0.1 milliseconds. In some embodiments, the reading of a non-ohmic device may meet performance specifications of a bipolar memristor type RRAM device (i.e., current density "J" of about $1\times10^4$ A/cm$^2$ at ±2.8V, and of about 100 A/cm$^2$ at ±2.0V).

Figure 7:
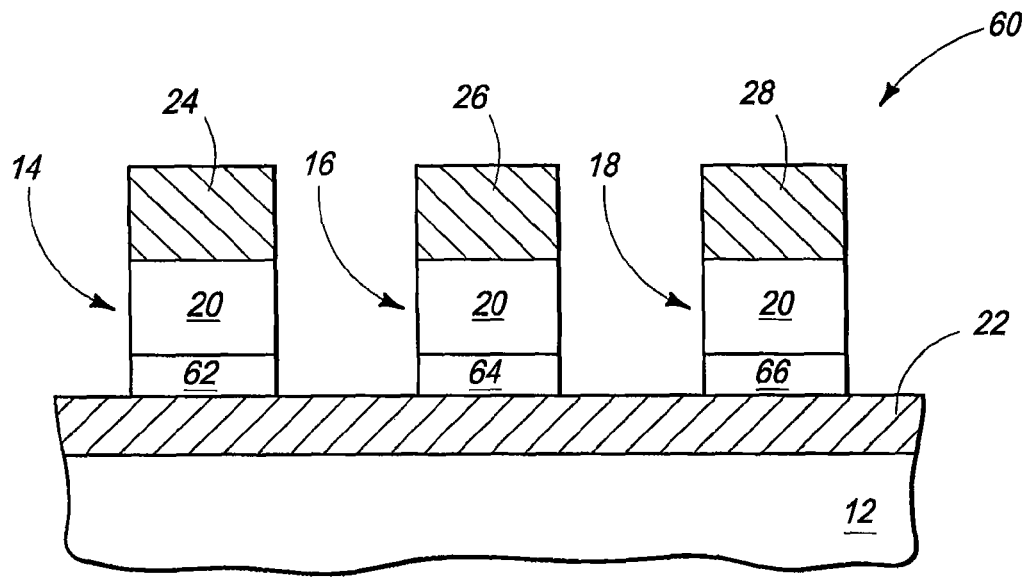
FIG. 7 is a diagrammatic cross-sectional view of a region of a semiconductor construction, illustrating a portion of another example memory array.

In some embodiments, non-ohmic select devices (for example, diodes) may be connected in electrical series with memristors of memory cells (for instance, memory cell structure 20 of FIG. 1 may be comprised by memristors, and diodes may be connected in electrical series with the memristors of the memory cells 14, 16 and 18 as select devices for the individual memory cells), and the duration of the reading operation may be tailored for the electrical series combinations of the memristors and the non-ohmic select devices. FIG. 7 shows a construction 60 which is similar to the construction 10 of FIG. 1, but which has non-ohmic select devices 62, 64 and 66 (for instance, diodes), between the conductive line 22 and the structures 20 of memory cells 14, 16 and 18. If the structures 20 correspond to memristors and the non-ohmic select devices are diodes, structures 20 may comprise one or more oxides between a pair of platinum electrodes, and the non-ohmic devices may comprise one or more insulative materials between a pair of electrodes. One of the electrodes of the memristors may be shared between the memristor and the adjacent non-ohmic device.

Although the construction of FIG. 7 has non-ohmic select devices between line 22 and the memory cell structures 20, in other embodiments non-ohmic select devices may be provided between lines 24, 26 and 28 and the memory cell structures alternatively, or in addition to, the provision of the select devices between line 22 and the memory cell structures. Also, although the select devices are shown as separate devices from line 22, in some embodiments the select devices may share conductive material with the line. For instance, the select devices may be diodes containing insulative material between a pair of electrodes, and one of the electrodes may comprise conductive material that is common to line 22.

The relative length of the read operation pulse to the minimum duration time required for a write operation of a memory cell may vary depending on the relative voltages utilized for the read and write operations, and depending on the configuration of the memory cell. Although the example embodiments describe read operation pulses which are an order of magnitude less than the minimum duration required for write operations, in other embodiments it may be possible to utilize read operation pulses which are closer to the minimum durations required for the write operations without risk of having the read operations inadvertently disturb an initial state of the memory cell.

Figure 6:
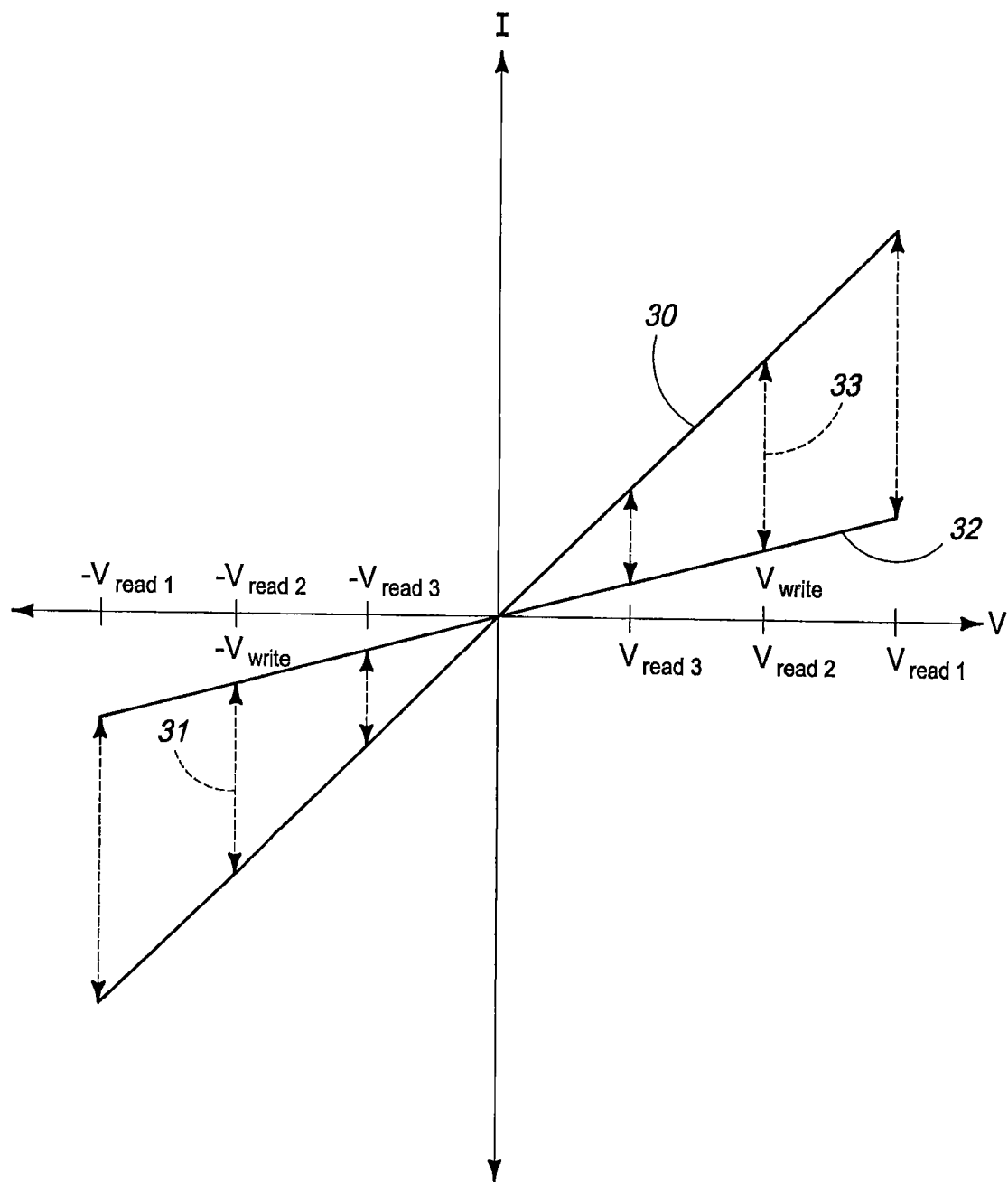
FIG. 6 is a graphical illustration of current vs. voltage relationships of an example memory cell, and illustrates current differences between memory states that will coincide with read operations conducted at various voltages.

FIG. 6 shows a graph of current (I) versus voltage (V) for the memory cell of FIG. 2, and illustrates reading operations that may be conducted using reading pulses shorter than a minimum duration required for a write operation. The memory cell comprises the memory states corresponding to the two intersecting lines 30 and 32. As discussed above regarding FIG. 2, the memory states become easier to distinguish from one another as the absolute value of the voltage passing through the memory cell increases.

The voltage levels $-V_{write}$ and $V_{write}$ correspond to the write voltages where the memory states 30 and 32 can interchange with one another.

FIG. 6 illustrates numerous example read voltages ($V_{read1}$, $V_{read2}$, $V_{read3}$, $-V_{read1}$, $-V_{read2}$ and $-V_{read3}$) that may be utilized during reading of the memory cell for determination of whether the memory cell is in the state represented by line 32, or the state represented by line 30. An advantage of utilizing a read pulse that is shorter than the minimum duration pulse required for a write operation of a frequency dependent memory device is that the read operation may be conducted at a voltage greater than or equal to the voltage of the write operation. As shown in FIG. 6, the difference between states 30 and 32 is larger, and accordingly easier to detect, at higher voltages. An advantage of some embodiments is that the reading of the memory cell may be conducted with a voltage having an absolute value that is at least as large as an absolute value of the voltage utilized during a writing operation, which may enable the state of the memory cell to be read with higher accuracy, and possibly greater speed, than is possible at the lower voltages used for prior art reading operations.

Although it may be advantageous in some embodiments to utilize reading operations having voltages of absolute values that meet or exceed the absolute value of voltage utilized during a writing operation, in other embodiments it may be desired to utilize reading operations having voltages of absolute value less than the absolute value of voltage utilized during a writing operation. In such other embodiments, there may still be advantages to utilizing a read pulse having a shorter duration than the minimum duration required for the write operation of a frequency dependent memory device. For instance, the short duration of the read pulse may make perturbation of a memory state less likely than would a longer duration read pulse; and/or may result in higher frequency (i.e., higher speed) of a read operation.

Figure 8:
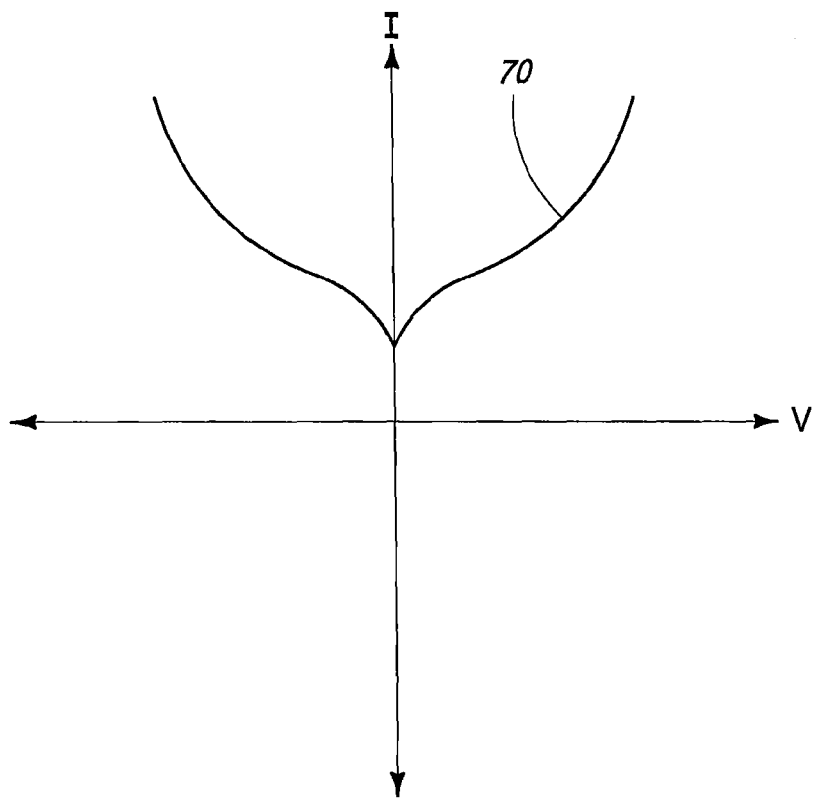
FIG. 8 is a graphical illustration of current vs. voltage relationships of an example non-ohmic device.

The current vs. voltage curves of FIGS. 2, 3 and 6 are example curves of some example devices. The various embodiments described herein may be used with numerous different devices, characterized by different current vs. voltage curves than those shown. For instance, FIG. 8 shows a curve 70 of current vs. voltage for a non-ohmic device that may be utilized additionally, or alternatively, to the devices described by the curves of FIGS. 2, 3 and 6. The curve 70 of FIG. 8 corresponds to one memory state of the device, and persons of ordinary skill will recognize that there may be another curve which corresponds to a different memory state of the device.

The various embodiments discussed herein may have application to any electronic system utilizing memory devices; with example electronic systems including computers, cars, airplanes, clocks, cellular phones, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of reading a memory cell, comprising:
providing a memory cell having a frequency dependent write operation, the write operation being conducted by providing a differential voltage to the memory cell along two orthogonal lines, the memory cell comprising a memristor comprising titanium oxide; and
reading the memory cell with a single pulse having a frequency that is at least an order of magnitude faster than a maximum frequency of the write operation.

2. The method of claim 1 wherein the memory cell comprises a non-ohmic device.

3. The method of claim 1 wherein the memory cell comprises a non-ohmic device in electrical series with the memristor.

4. The method of claim 1 wherein the reading is conducted while utilizing a voltage with an absolute value that is greater than an absolute value of a voltage utilized in the write operation.

5. The method of claim 1 wherein the reading is conducted while utilizing a voltage with an absolute value that is less than or equal to an absolute value of a voltage utilized in the write operation.

6. A method of reading a memory cell, comprising:
providing a memory cell having a frequency dependent write operation, the write operation being conducted by providing a differential voltage to the memory cell along two orthogonal lines, the memory cell comprising a memristor comprising one or both of hafnium oxide and zirconium oxide; and reading the memory cell with a single pulse having a frequency that is at least an order of magnitude faster than a maximum frequency of the write operation.

7. A method of reading a memory cell, comprising:
providing an integrated circuit which includes a memory cell having a write operation that occurs at a write voltage and that comprises a lag between a time that the write voltage is applied and a time that the write operation is completed, the write voltage being a differential voltage provided along two orthogonal lines, the memory cell comprising a memrisor comprising one or more of titanium oxide, hafnium oxide and zirconium oxide; and
reading the memory cell with a single pulse that is at least an order of magnitude faster than said lag, and that occurs at a read voltage having an absolute value that is less than or equal to an absolute value of the write voltage.

8. The method of claim 7 wherein the memory cell comprises a non-ohmic device.

9. The method of claim 7 wherein the memory cell comprises a non-ohmic device in electrical series with the memristor.

10. A method of using a memory cell, comprising:
writing to an integrated circuit memory cell with a first pulse to change the memory cell from one memory state to another, the first pulse being provided for a first duration of time, the writing being conducted by providing a differential voltage to the memory cell along two orthogonal lines, the memory cell comprising a memrisor comprising one or more of titanium oxide, hafnium oxide and zirconium oxide; and
reading the memory cell to ascertain which of the memory states the memory cell is in; the reading being conducted with a second pulse having a second duration of time that is at least an order of magnitude less than the first duration of time; the reading not changing the memory cell from one memory state to another.

11. The method of claim 10 wherein:
the first pulse is conducted with a first voltage having a first absolute value;
the second pulse is conducted with a second voltage having a second absolute value; and
the second absolute value is less than or equal to the first absolute value.

12. The method of claim 10 wherein:
the first pulse is conducted with a first voltage having a first absolute value;
the second pulse is conducted with a second voltage having a second absolute value; and
the second absolute value is greater than the first absolute value.

13. The method of claim 10 wherein the memory cell comprises a non-ohmic device.

14. The method of claim 10 wherein the memory cell comprises a non-ohmic device in electrical series with the a memristor.

* * * * *

UNITED STATES PATENT AND TRADEMARK OFFICE
CERTIFICATE OF CORRECTION

| | | |
|---|---|---|
| PATENT NO. | : 8,675,392 B2 | Page 1 of 1 |
| APPLICATION NO. | : 13/463794 | |
| DATED | : March 18, 2014 | |
| INVENTOR(S) | : Bhaskar Srinivasan et al. | |

It is certified that error appears in the above-identified patent and that said Letters Patent is hereby corrected as shown below:

In the Claims

In column 9, line 11, in claim 7, delete "memrisor" and insert -- memristor --, therefor.

In column 10, lines 1-2, in claim 10, delete "memrisor" and insert -- memristor --, therefor.

Signed and Sealed this
Twenty-ninth Day of July, 2014

Michelle K. Lee
*Deputy Director of the United States Patent and Trademark Office*